(12) United States Patent
Miller

(10) Patent No.: US 7,154,259 B2
(45) Date of Patent: Dec. 26, 2006

(54) ISOLATION BUFFERS WITH CONTROLLED EQUAL TIME DELAYS

(75) Inventor: Charles A. Miller, Fremont, CA (US)

(73) Assignee: FormFactor, Inc., Livermore, CA (US)

( * ) Notice: Subject to any disclaimer, the term of this patent is extended or adjusted under 35 U.S.C. 154(b) by 97 days.

(21) Appl. No.: 10/693,133

(22) Filed: Oct. 23, 2003

(65) Prior Publication Data

US 2005/0088167 A1   Apr. 28, 2005

(51) Int. Cl.
*G01R 31/00* (2006.01)
(52) U.S. Cl. .................. 324/158.1; 324/73.1; 324/754
(58) Field of Classification Search ........ 324/754–765, 324/158.1, 73.1; 702/89; 327/250–251, 327/261–262, 276, 277, 284, 269, 271, 538, 327/27
See application file for complete search history.

(56) References Cited

U.S. PATENT DOCUMENTS

| | | | | |
|---|---|---|---|---|
| 5,070,297 A | * | 12/1991 | Kwon et al. ................. | 324/754 |
| 5,445,635 A | * | 8/1995 | Denen et al. .................. | 606/27 |
| 6,157,231 A | | 12/2000 | Wasson ....................... | 327/156 |
| 6,181,145 B1 | * | 1/2001 | Tomita et al. ............... | 324/754 |
| 6,570,397 B1 | * | 5/2003 | Mayder et al. ............. | 324/754 |
| 6,603,323 B1 | | 8/2003 | Miller et al. ................. | 324/754 |
| 6,622,103 B1 | * | 9/2003 | Miller ......................... | 702/89 |
| 6,771,087 B1 | * | 8/2004 | Oz et al. ..................... | 324/763 |

\* cited by examiner

*Primary Examiner*—Vinh P. Nguyen
(74) *Attorney, Agent, or Firm*—N. Kenneth Burraston

(57) ABSTRACT

A system is provided for controlling the delay in an isolation buffer. Multiple such isolation buffers are used to connect a single signal channel to multiple lines and controlled to provide an equal delay. Isolation buffer delay is controlled to be uniform by varying either power supply voltage or current. A single delay control circuit forming a delay-lock loop supplies the delay control signal to each buffer to assure the uniform delay. Since controlling delay can also vary the output voltage of each isolation buffer, in one embodiment buffers are made from two series inverters: one with a variable delay, and the second without a variable delay providing a fixed output voltage swing. To reduce circuitry needed, in one embodiment an isolation buffer with a variable power supply is provided in a channel prior to a branch, while buffers having a fixed delay are provided in each branch. A wafer test system can be configured using the isolation buffers having equal delays to enable concurrently connecting one tester channel to multiple wafer test probes.

14 Claims, 7 Drawing Sheets

ISOLATION BUFFERS WITH CONTROLLED EQUAL TIME DELAYS

BACKGROUND

1. Technical Field

The present invention relates in general to distributing a signal to multiple lines through isolation buffers to prevent signal degradation. More particularly, the present invention relates to a system for connecting a single test signal channel of a wafer test system to multiple test probes to enable testing of integrated circuits (ICs) on a wafer.

2. Related Art

Fanning out a signal to multiple transmission lines, as illustrated in FIG. 1, in many cases requires that the signal arrive at multiple destinations with an equal phase shift. For example to fan out a clock signal, a clock tree is used to distribute the clock signal so that signals arriving on multiple lines are synchronized, or distributed without a phase difference at the line destinations. Typically to assure no phase difference, the multiple transmission lines are laid out to have the same length. In some cases, however, it may be impossible to route the multiple lines so that all are the same length. Further, a fault or line degradation may occur on one of the multiple lines that can create a return signal causing interference and significant attenuation of signals on other lines.

Isolation buffers may be provided in the path of each of the multiple transmission lines, as illustrated in FIG. 2, to reduce the effect of faults. Unfortunately, the isolation buffer circuitry will not only add delay to the signals, but it will typically introduce an arrival delay uncertainty, or effectively create phase differences at the destination of the multiple transmission lines. Circuit construction variations and temperature variations are typical contributors to delay variations from one buffer circuit to another that can prove problematic to synchronous circuits.

Although a clock tree provides one example where a signal should be distributed synchronously, it would be convenient to provide such a distribution in other systems if equal phase delays could be maintained. FIG. 3 shows a simplified block diagram of one such system—a test system for testing ICs on a semiconductor wafer. The test system includes a tester 2 made up of a test controller 4 connected by a communication cable 6 to a test head 8. The test system further includes a prober 10 made up of a stage 12 for mounting a wafer 14 being tested, the stage 12 being moved into contact with probes 16 on a probe card 18. Cameras 20 and 22 are shown attached to the prober 10 and the test head 8 to enable precise alignment of the probes 16 with contacts of ICs formed on the wafer 14.

In the test system, test data is generated by the test controller 4 and transmitted through the communication cable 6 to the test head 8. Test results then provided from ICs on the wafer are received by the test head 8 and transmitted to the test controller 4. The test head 8 contains a set of tester channels. Typically test data provided from the test controller 4 is divided into the individual tester channels provided through the cable 6 and separated in the test head 8 so that each channel is carried to a separate one of the probes 16. The channels from the test head 8 are linked to the probes 16 through electrical connections 24.

In most cases each of the probes 16 contacts a single input/output (I/O) terminal or pad on an IC of the wafer 14 being tested. Each tester channel may then either transmit a test signal to an IC input or monitor an IC output signal to determine whether the IC is behaving as expected in response to its input signals. FIG. 4 shows details where each tester channel is linked to a single probe. In FIG. 4, two signal channel transmission lines 31 and 32 are shown provided to two separate probes $16_1$ and $16_2$ contacting pads on two separate ICs $37_1$ and $37_2$ on the wafer 14. Each of the channel transmission lines 31 and 32 is driven by a respective driver 34 and 35, the drivers 34 and 35 typically being located in the test controller 4. Test data from the channel transmission lines 31 and 32 are distributed through the probe card 18 to the separate probes $16_1$ and $16_2$. Once testing is complete, the wafer is diced up to separate the ICs $37_1$–$37_4$.

Since there are usually more I/O pads than available tester channels, a tester can test only a portion of the ICs on the wafer at any one time. Thus, a "prober" holding a wafer must reposition the wafer under the probes several times so that all ICs can be tested. It would be advantageous due to test time savings and prevention of possible wafer damage due to multiple contacts with a test system if all ICs on a wafer could be contacted and tested concurrently without having to reposition the wafer.

One way to reduce the number of tester channels needed to test an entire wafer without repositioning the wafer is to distribute or fan out a single test channel to multiple lines, as generally illustrated in FIG. 1, potentially allowing the same tester channel to provide signals to I/O pads of a large number of ICs on a wafer. Although one channel can be fanned out, with fan out a fault identified in test results provided from one DUT may falsely appear in the test results of another DUT. For example a fault in the contact pad on one DUT which is shorted to ground will short the contact pad on a second DUT to ground, causing the second DUT to falsely test as bad. Further, an open circuit fault on one of the lines will render a wafer connected to the line untestable. Either a short or an open on a line will severely attenuate a test signal provided from the same channel to other lines intended for other DUTs.

One way of preventing a fault at or near any I/O pad from severely attenuating a test signal passing through the interconnect system is to place isolation resistors between the probes and a channel line branch point. The isolation resistors prevent a short to ground on one DUT from pulling the other DUT to ground, and likewise significantly reduce the attenuation resulting from an open circuit on one line. FIG. 7 of U.S. Pat. No. 6,603,323 entitled "Closed-Grid Bus Architecture For Wafer Interconnect Structure," describes the use of such isolations resistors. Although reducing the affect of faults, isolation resistors do not completely eliminate the attenuation caused by the faults. Further, with a parasitic capacitance on the lines, adding isolation resistors introduces an RC delay that can adversely affect the rise and fall time of test signals, potentially creating erroneous test results.

Another way to isolate faults without introducing resistor attenuation is to include an isolation buffer between each channel branch point and probe, as generally illustrated in FIG. 2, and as illustrated in more detail for a test system in FIG. 5. In FIG. 5, one transmission line channel 42 from a driver 40 of a tester is fanned out to two bus lines $50_1$ and $50_2$ in the probe card 18 to provide the channel signal to separate probes $42_1$ and $42_2$ for contacting pads on two ICs $37_1$ and $37_2$ (each labeled as a device under test "DUT"). Of course a channel could likewise be fanned out over multiple bus lines to multiple pads on the same IC.

A draw back to isolation buffers, as indicated previously, is that they introduce an uncertain delay into the transmission of test signals from the tester to the DUTs on a wafer.

The delay is uncertain because the delay through a buffer can change with changes in temperature and power supply voltage. The signal delay from the tester to DUTs on a wafer can change during performance of a sequence of tests on DUTs of a wafer, creating inaccurate test results.

It would be desirable to distribute a signal to multiple transmission lines and provide isolation from faults without introducing an unequal delay, both for a wafer test system, and other systems that distribute a signal over multiple transmission lines.

SUMMARY

In accordance with the present invention, circuitry is provided to keep the delay through multiple isolation buffers constant. Providing branching using isolation buffers having equal delays allows creation of an efficient wafer test system, and further allows creation of other systems requiring branch isolation while maintaining equal line delays.

To prevent isolation buffers from introducing an uncertain delay into the transmission of a signal on multiple lines, in one embodiment buffer delay is controlled by varying the power supply voltage potential provided to the isolation buffers. Alternatively, the buffer delay can be adjusted by controlling current, such as by controlling current through an isolation buffer configured as a differential amplifier.

To assure isolation buffer delay is uniform, buffer delay is controlled by a central delay control circuit that controls the power supply voltage or current provided to each isolation buffer. The delay control circuit includes an oscillator providing a signal to the input of a reference delay line and a reference buffer. The reference delay line and reference buffer then provide inputs to a phase comparator. The frequency and stability of the oscillator is not critical to the operation of the delay circuit since the phase comparator is always comparing identical but delayed versions of the oscillator transitions. The reference delay line has a length chosen to set the delay of the isolation buffers. The output of the phase comparator is provided through a loop filter to drive either the voltage or current delay control inputs of the reference buffer, as well as the isolation buffers provided in branches. As configured, the delay control circuit effectively forms a delay-lock loop where the reference buffer will provide a delay equal to the reference delay line, as will each of the isolation buffers in the system receiving the output of the delay-lock loop.

Since varying the delay of the isolation buffers can also result in varying the output voltage of each isolation buffer, in a further embodiment two buffers are used in sequence between each channel branch point and probe. The first buffer has a variable delay control applied, while the second buffer has no delay control and can supply the system voltage at its output unaltered.

In a further embodiment to reduce circuitry required relative to using two buffers in each branch, an isolation buffer with its delay controlled by the delay control circuit is provided in a channel prior to the branch point. Buffers without delay control having fixed system output voltages are then provided in each branch point. The reference buffer in the delay control circuit is then made up of two buffers, one having its delay controlled to match the variable delay isolation buffers, while the second has no delay control so it supplies a fixed system output voltage and matches the buffers provided in each branch.

For a wafer test system, simply changing a probe card to one having channels branched through equal delay isolation buffers made in accordance with the present invention allows a tester with a limited number of channels to test all ICs on a wafer. With such branching the prober does not need repositioning to contact the wafer a number of times, as would be required without using branches in the probe card. The cost of a tester is significant relative to the cost of a probe card, so although modifying the tester to include the delay isolation buffers is possible, simply substituting probe cards with the isolation buffers will be a significantly less expensive alternative.

BRIEF DESCRIPTION OF THE DRAWINGS

Further details of the present invention are explained with the help of the attached drawings in which.

DETAILED DESCRIPTION

Figure 1:
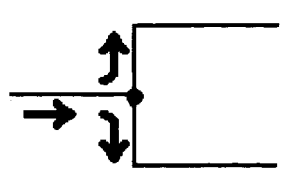
FIG. 1 shows a single transmission line fanned out to multiple signal lines.
Figure 2:
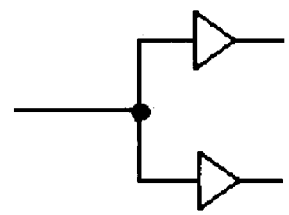
FIG. 2 shows a single transmission line fanned out to multiple lines with isolation buffers provided in the multiple lines.
Figure 3:
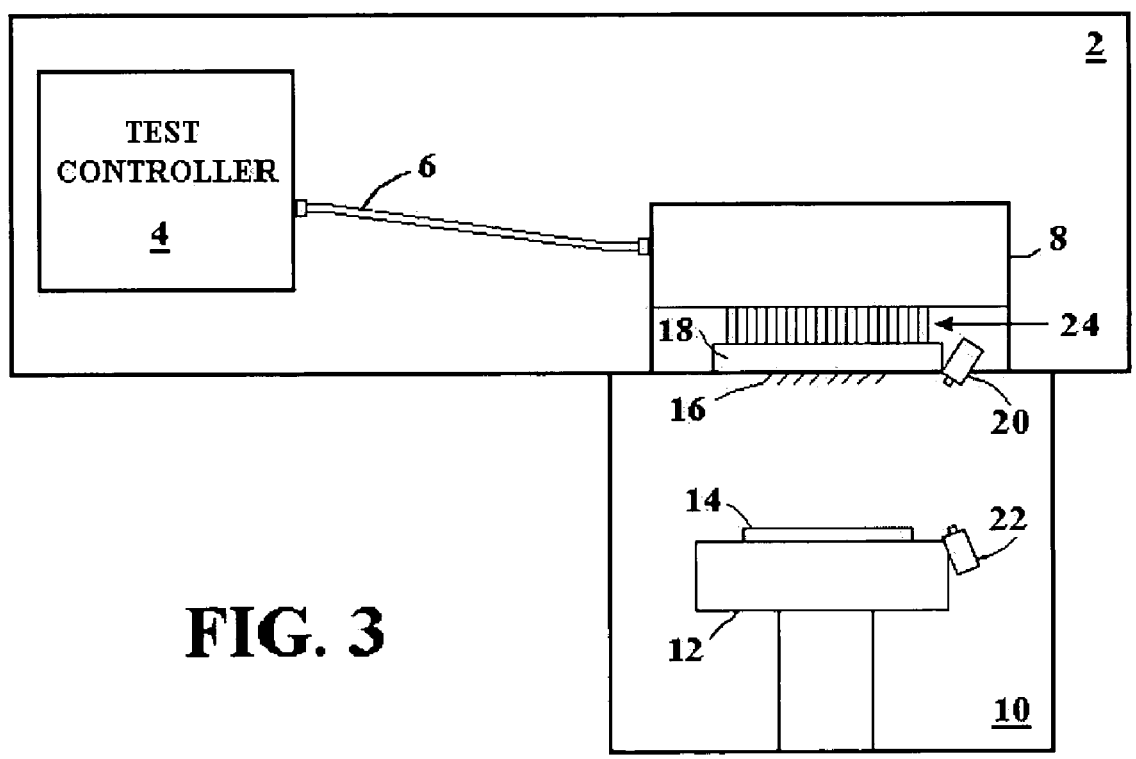
FIG. 3 shows a simplified block diagram of a conventional test system for testing ICs on a semiconductor wafer.
Figure 4:
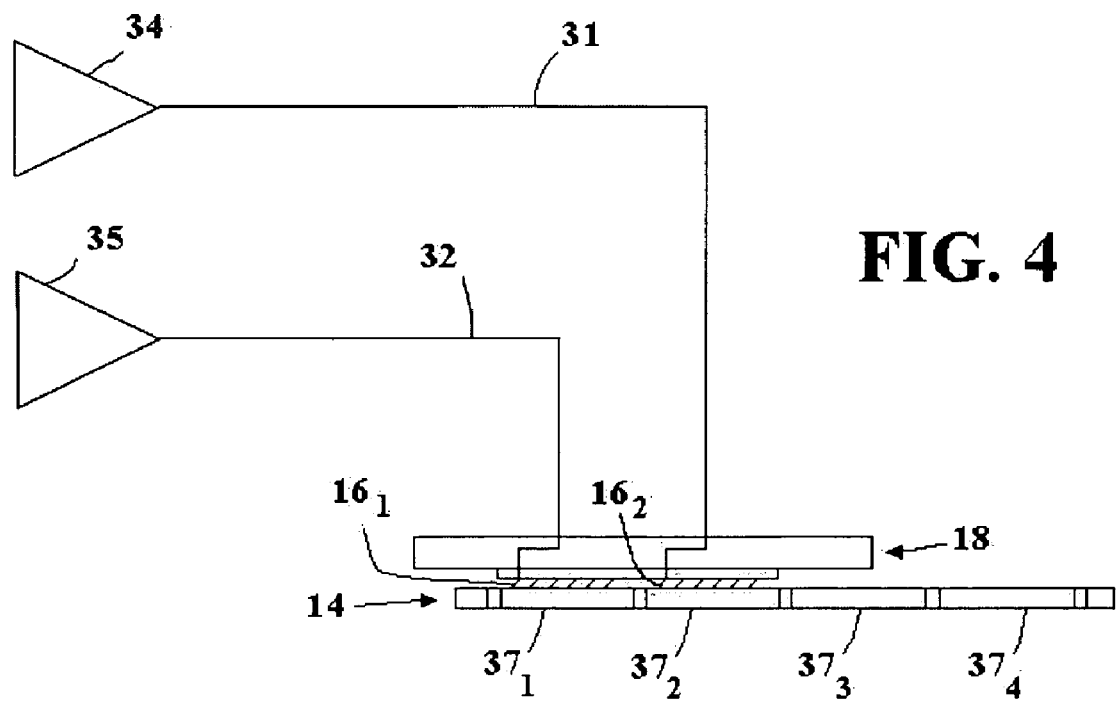
FIG. 4 illustrates a conventional test system arrangement where each channel is linked to a single probe.
Figure 5:
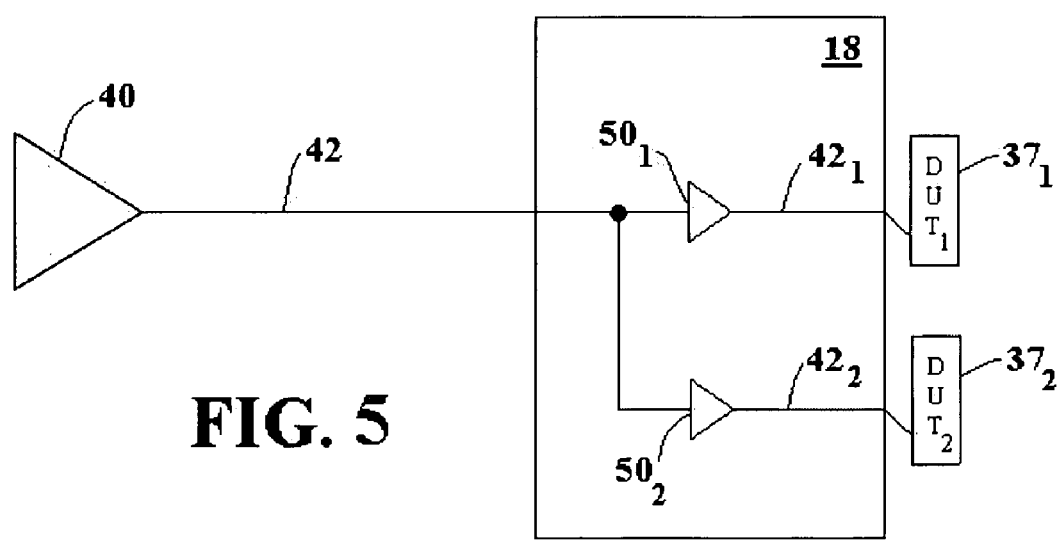
FIG. 5 illustrates how a single channel of a wafer tester can be fanned out to multiple probes with isolation buffers for concurrently testing multiple ICs using the single channel.
Figure 6:
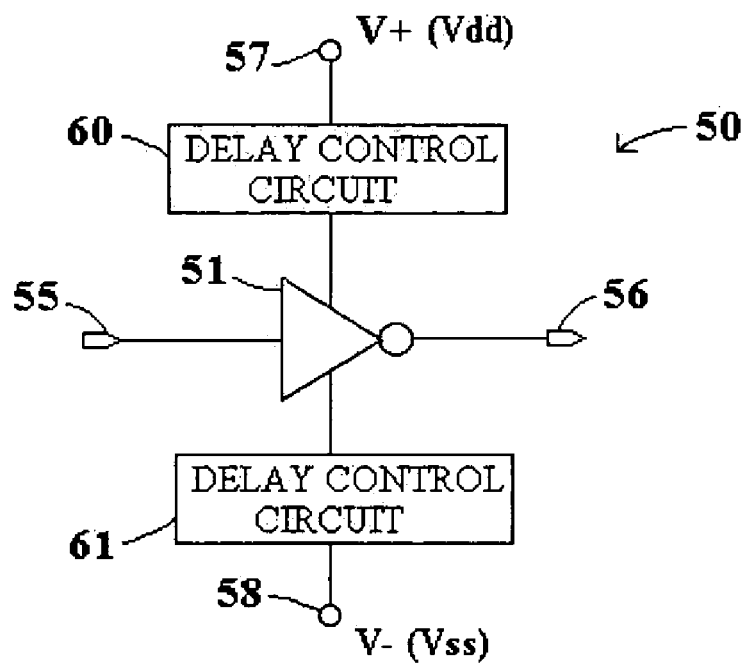
FIG. 6 shows one embodiment of an isolation buffer with delay controlled by changing the power supply bias voltage supplied to the buffer.

FIG. 6 shows an embodiment of the isolation buffer 50 with delay control which can change the bias voltage supplied to the buffer 50. In FIG. 6, the buffer 50 includes an inverter 51 having a signal input 55 and output 56. The system power supply voltage rails 57 and 58 carry a high voltage V+ and a low voltage V−. With CMOS devices, the bias or power supply voltages are typically referred to as Vdd and Vss. Typically, the rail voltages V+ and V− are supplied directly to the buffer. The voltage V+, for example, may be 5 volts, while V− may be ground or zero volts. However, in FIG. 6 with the delay control circuit set to control delay by varying power supply voltage, the voltage rails V+ and V− are provided through respective delay control circuits 60 and 61 as the high and low power supply voltages to inverter 51. Although shown as two separate delay control circuits 60 and 61 in FIGS. 5 and 6, a single combined circuit can be used. Further, although two circuits 60 and 61 are described to vary both the V+ and V− voltages, either one of the voltages V+ or V− can be varied alone to achieve the desired delay.

Although it has been described to control buffer delay by changing the voltage supplied to the buffer, a problem with doing so is that a change in the voltage supplied to a buffer, such as inverter 51, changes the high and low voltages supplied at its output 56. In accordance with the present invention, this problem is addressed by implementing each isolation buffer as a pair of inverters (e.g., CMOS inverters), as illustrated in FIG. 7.

Figure 7:
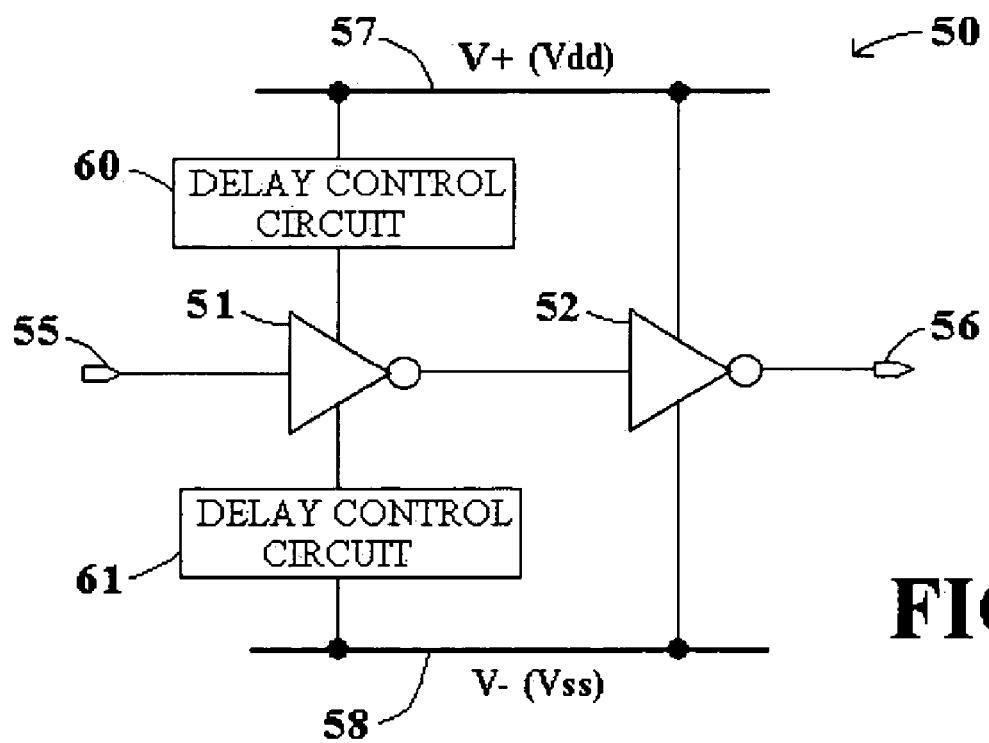
FIG. 7 illustrates an isolation buffer formed by two series inverters, with only the first having a power supply bias voltage altered.

FIG. 7 illustrates such an implementation where a buffer is formed by modifying FIG. 6 to add an inverter 52 in series with the inverter 51. With delay controlled by changing power supply bias voltage, only the voltage supplied to the first inverter 51 is changed to control its delay. The power supply bias voltage to the second inverter 52 remains fixed at the V+ and V− rails. Because the output of the second inverter 52 is the output 56 of the overall buffer 50, the high and low output voltages of the overall buffer 50 are fixed at the V+ and V− rails. Because the isolation buffer output in some cases must remain fixed at the V+ and V− rails, the circuit of FIG. 7 uses the second inverter 52 with a fixed power supply voltage.

With a different delay control circuit provided for each isolation buffer, temperature and device characteristics may vary the delay between isolation buffers. A single delay control circuit to control the delay provided by each isolation buffer is, therefore, preferable. Use of a single delay control circuit for multiple isolation buffers, as opposed to multiple delay control circuits, can also significantly reduce overall circuitry required for a test system.

Figure 8:
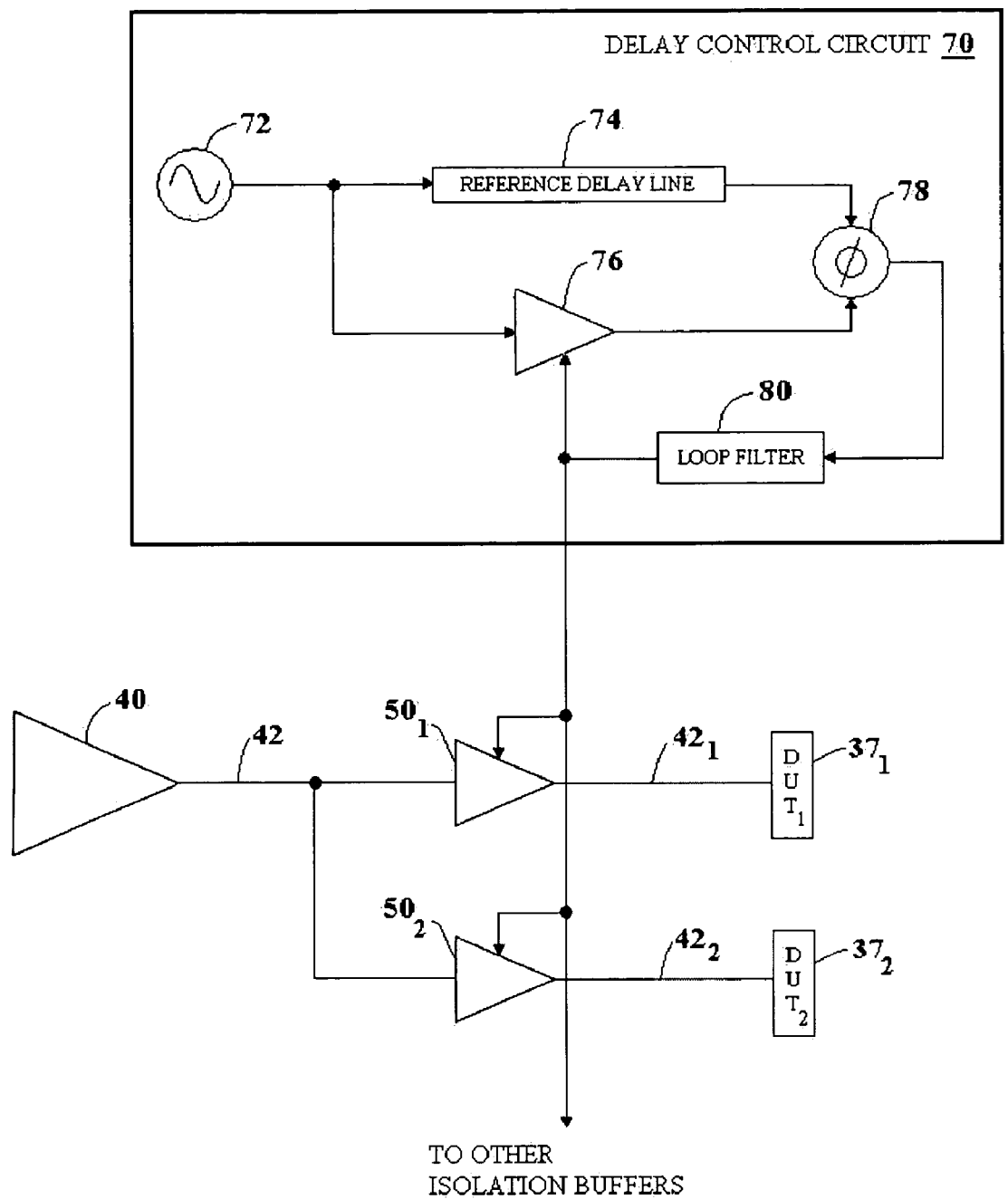
FIG. 8 shows details of a delay control circuit for controlling the delay of multiple isolation buffers.

Details of a single delay control circuit for controlling the delay of multiple buffers are shown in FIG. 8. The delay circuit 70 is shown connected to two isolation buffers $50_1$ and $50_2$ of a wafer tester configuration, similar to FIG. 5. However, the delay control circuit 70 can likewise be provided to more than two isolation buffers, or provided in branches of other types of circuits than a wafer tester such as a clock tree. Further, as would be understood by a person of ordinary skill, the delay control circuit 70 shown can be configured to function as a combination of the delay control circuits 60 and 61 shown in FIGS. 5 and 6, or individual ones of the delay control circuits 60 and 61.

The delay control circuit 70 includes an oscillator or clock generator 72 for creating a periodic signal provided to inputs of both a reference delay line 74 and a reference buffer 76. The oscillator can be formed from series connected inverters, or an inverter in series with a delay element such as a resistor. The oscillator signal frequency and duty cycle are not critical since an error signal is only derived from the rising and falling edges of the same period or cycle of the oscillator that is simultaneously input to the reference delay line 74 and reference buffer 76.

The reference delay line 74 is constructed to have a delay equal to the desired delay through isolation buffers $50_1$ and $50_2$. The dimensions of the reference delay line 74 line can be set, as would be understood by a person of ordinary skill in the art, to control the delay through the delay line 74. The reference delay line 74 can be constructed either on an integrated circuit containing the isolation buffers $50_1$ and $50_2$, reference buffer 76, phase comparator 78, etc., or it can be provided external to such an integrated circuit. Since the physical dimensions of components on an integrated circuit can be controlled lithographically, part-to-part variations can be minimized. In demanding applications where more precise control of the absolute or relative delay is required, laser trimming can be applied to tune the delay line 74. Without laser trimming, slight variations in the transmission line delay may be introduced due to the Tce of the materials or substrate used to construct the transmission line. In these cases, the relatively small delay variations of the transmission line can be stabilized by tuning the delay locked loop.

The phase comparator 78 measures the difference in phase of the outputs from the reference delay line 74 and the reference buffer 76. The output of the phase comparator 78 drives a low pass filter, or loop filter circuit 80. The filter 80 filters the phase comparator signal to generate a control voltage that is proportional to the phase error. This phase error control voltage is then used to adjust the delay of the reference buffer 76. The combination of the voltage controlled reference buffer 76, phase comparator 78 and low pass filter 80 is commonly referred to as a "delay-lock loop." The delay control circuit 70, thus, provides a time process and temperature independent reference to the reference buffer 76 and further applies the control voltage to multiple isolation buffers, such as $50_1$ and $50_2$.

The delay control circuit 70 of FIG. 8 forces the delay through the reference buffer 76 to match the delay through the reference delay line 74. Because the delay through the reference delay line 74 is not typically changed by ambient conditions (e.g., temperature or voltage of the power supply), the delay control circuit 70 keeps the delay through the reference buffer 76 constant, despite changes in the ambient temperature or voltage of its power supply.

The delay control circuit 70 of FIG. 8 further controls the bias voltage of isolation buffers $50_1$ and $50_2$ which are provided in branches $42_1$ and $42_2$ between a single channel 42 and DUTs $37_1$ and $37_2$. Thus, the delay control circuit 70 tends to keep the delay through the reference buffer 76 and isolation buffers $50_1$ and $50_2$ constant. Although two isolation buffers $50_1$ and $50_2$ are shown, additional buffers provided to other branches can have delay controlled by the circuit 70, as illustrated.

The delay control circuit 70 can be connected to control either, or both of the voltages V+ and V− supplied to the reference buffer 76 and the isolation buffers $50_1$ and $50_2$ to set the buffer delay. Thus, the connection from the loop filter 80 can be either a single line to provide an altered voltage from one of V− or V+, or a bus with two lines to provide a voltage altered from each of V+ and V−.

To assure the delay between buffers is substantially the same, the reference buffer 76 and isolation buffers $50_1$, $50_2$, etc. should be as similar as possible, or at least as similar as necessary to keep the delay through isolation buffers $50_1$ and $50_2$ within an acceptable difference. Preferably, the reference buffer 76 and isolation buffers $50_1$ and $50_2$ are manufactured on the same wafer, and can possibly be provided on the same IC chip to assure similar device and temperature characteristics.

The reference buffer 76 and isolation buffers $50_1$ and $50_2$ can be either the single inverter configuration shown in FIG. 6, or series inverters shown in FIG. 7. With the single inverter configuration of FIG. 6, the delay control circuit 70 controls either or both of the power supply voltages supplied to all of the buffer inverters. With the series inverter configuration of FIG. 7, the delay circuit 70 controls the supply bias voltage of the first inverter in the series, while the power supply voltages remain fixed at V+ and V− for the second series inverter. With the isolation buffer configuration of FIG. 7, both the reference buffer 76 and the isolation buffers $50_1$ and $50_2$ preferably include series inverters to maximize the similarity between the reference and isolation buffers so that delay is precisely controlled to a substantially identical value in each buffer.

Figure 9:
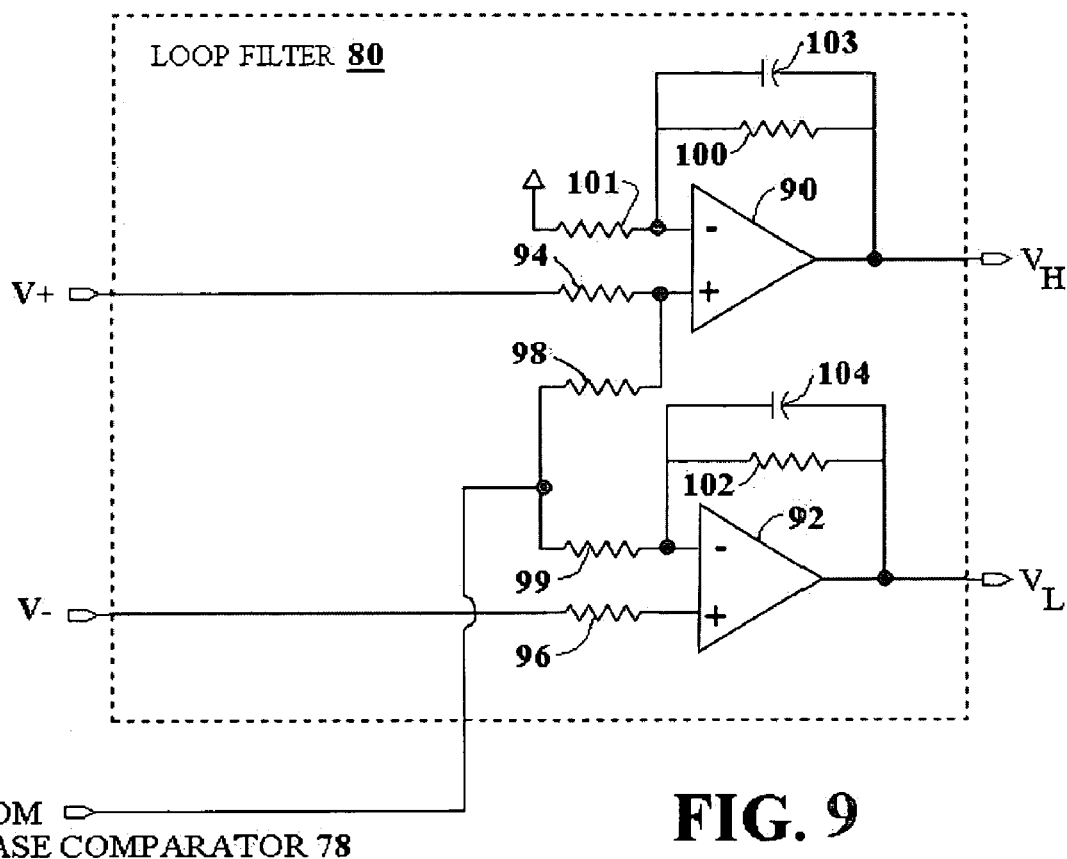
FIG. 9 shows details of an embodiment of the loop filter of FIG. 8.

FIG. 9 shows details of one embodiment for the low pass filter, or loop filter 80. The loop filter 80 functions to integrate the output of the phase comparator 78, shown in FIG. 8, and provide two centralized delay control voltages $V_H$ and $V_L$ to the reference buffer 76 and isolation buffers $50_1$ and $50_2$ centered between the V+ and V− system voltage rails. The circuit shown in FIG. 9 provides one embodiment for the loop filter 80, but the filter design is not critical and can be replaced by another low pass filter circuit configuration as would be understood by a person of ordinary skill. For example, a passive low pass filter using capacitors and resistors could replace the loop circuit 80 shown in FIG. 9 which includes active element amplifiers 90 and 92.

The loop filter circuit 80 of FIG. 9 receives as inputs the power supply rail voltages V+ and V− and the output of the phase comparator 78. From these inputs, the circuit of FIG. 9 generates control voltages $V_H$ and $V_L$. The voltage $V_H$ is provided as a high power supply input (i.e., the Vdd input for a CMOS inverter) to the reference buffer 76 and isolation buffers, while $V_L$ is provided as a low power supply input (i.e., the Vss input for a CMOS inverter) to the reference buffer 76 and isolation buffers.

The loop filter 80 includes two differential amplifiers 90 and 92. The output of amplifier 90 provides the control voltage $V_H$, while the output of amplifier 92 provides the control voltage $V_L$. A resistor 94 connects the rail voltage V+ to the non-inverting (+) input of amplifier 90, while a resistor 96 connects the rail voltage V− to the non-inverting (+) input of amplifier 92. The output from the phase comparator 78 is connected through a resistor 98 to the non-inverting (+) input of amplifier 90 and through a resistor 99 to the inverting (−) input of amplifier 92. Feedback is provided in amplifier 90 by a resistor 100 and capacitor 103 connecting its output to its inverting (−) input, along with a resistor 101 connecting the inverting input to ground. Feedback is provided in amplifier 92 by a resistor 102 and capacitor 104 connecting its output to its inverting (−) input. The feedback capacitors 103 and 104 enable the amplifiers 90 and 92 to function as integrators to reduce noise. The resistors 94, 96, 98 and 99 function to assure the voltages $V_H$ and $V_L$ are centered between V+ and V−.

To drive a large number of buffers, power amplifiers may be added to amplify the $V_H$ and $V_L$ outputs. It may also be desirable to place capacitors between the $V_H$ and $V_L$ outputs and the respective inputs of the isolation buffers. Such capacitors filter out high frequency noise from the power supply.

The circuit of FIG. 9 is designed to keep the digital signal at the output of an isolation buffer from having its power supply inputs varied, but centered between the V+ and V− power supply levels. By doing so, the transition of a subsequent circuit will occur at approximately an equal time on the rising or falling edge of a signal as it would if the V+ and V− levels remained unaltered. By not having the output of the isolation buffer centered between V+ and V−, one edge would trigger a subsequent circuit transition sooner than normal possibly causing erroneous test results to occur.

With the circuitry shown in FIG. 9, the greater the phase difference signal output from the phase comparator 78, the greater the difference between $V_H$ and $V_L$. When applied to the isolation buffers, the greater the difference between $V_H$ and $V_L$ from the buffer delay control circuit 70, the less the delay provided by the isolation buffers.

Figure 10:
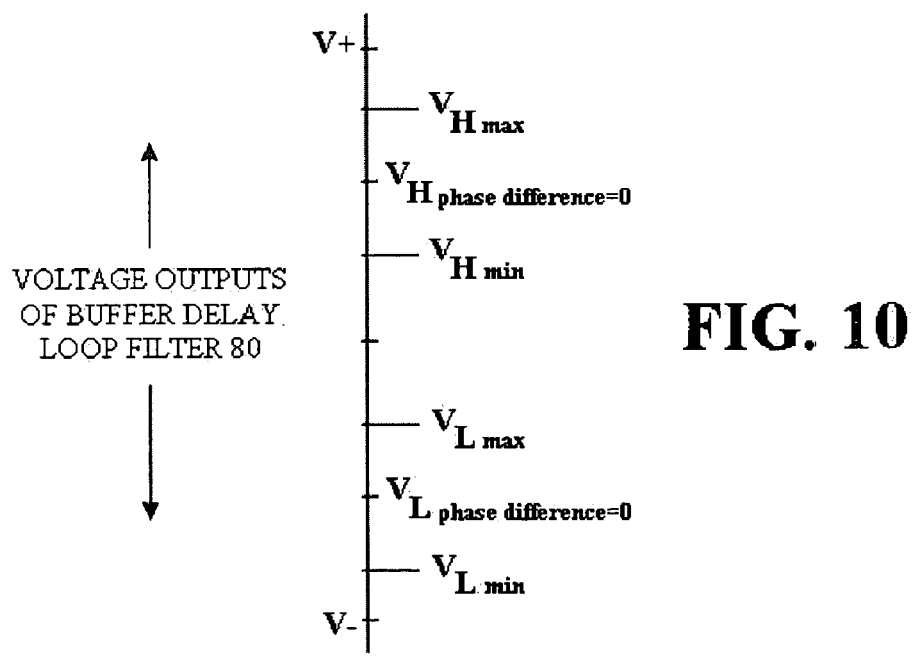
FIG. 10 shows a chart illustrating operating ranges for the $V_H$ and $V_L$ signals output from the circuit of FIG. 9.

FIG. 10 shows a chart illustrating operating ranges for the $V_H$ and $V_L$ signals output from the circuit of FIG. 9. The ranges of $V_H$ and $V_L$ will depend on values chosen for resistors 94, 96, 98 and 99. The resistors 94, 96, 98 and 99 are preferably chosen so that with changes in phase difference, an equal variation occurs in $V_H$ and $V_L$ to assure the centerline voltage between $V_H$ and $V_L$ remains the same. The values of the resistors are further chosen so that $V_H$ is in the middle of its total range and $V_L$ is in the middle of its total range when the phase difference output signal from the phase comparator 78 is 0. The specific range for $V_H$ and $V_L$ will vary depending on the needs of the particular circuit being implemented.

Figure 11:
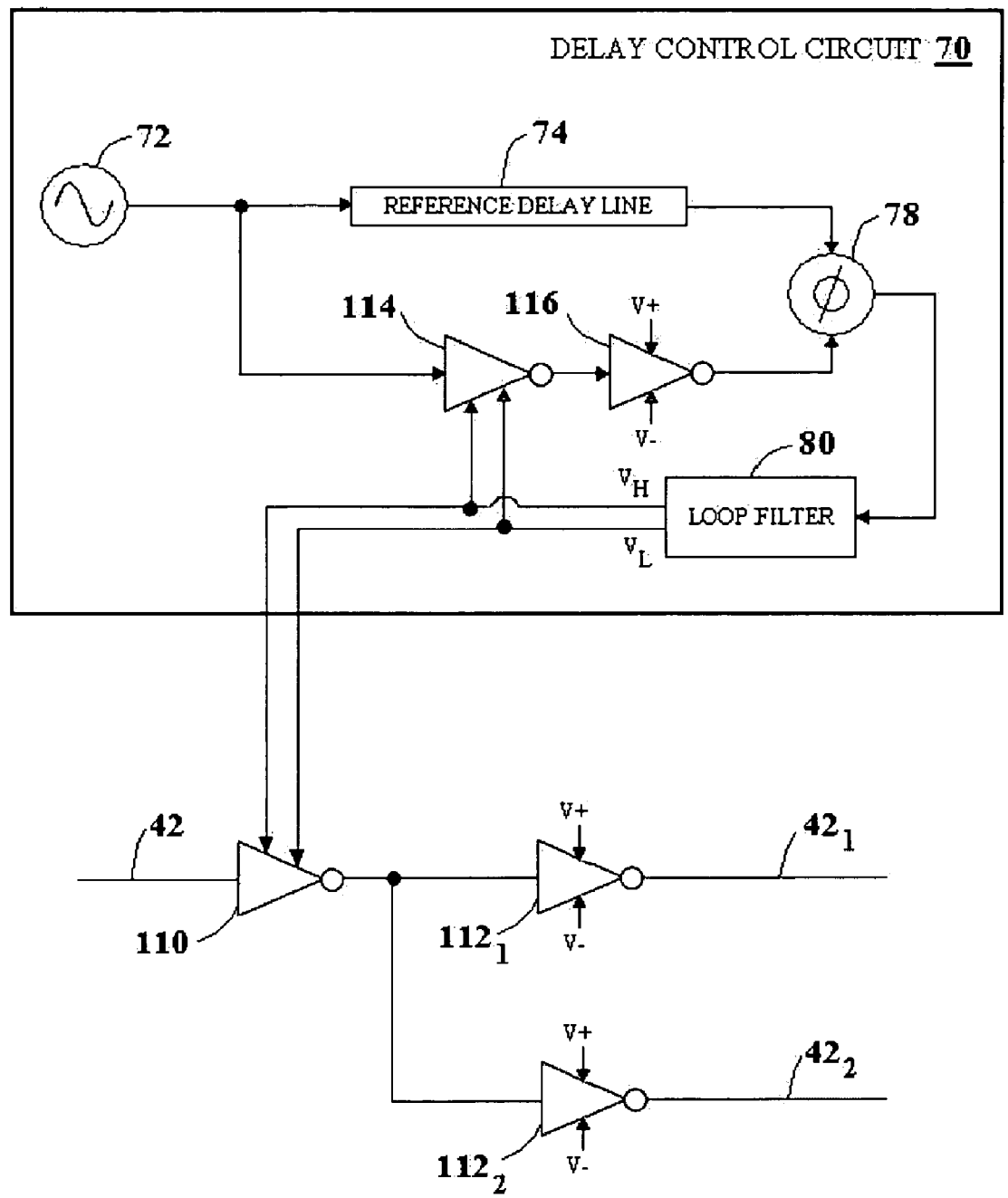
FIG. 11 shows an alternative to the circuit of FIG. 8 with a variable supply voltage isolation buffer placed before a channel branch point, and a fixed voltage buffer provided in each branch.

FIG. 11 shows an alternative to the isolation buffer and delay control circuit of FIG. 8, configured to reduce the overall circuitry required. In FIG. 11, a single variable delay isolation buffer 110 is placed in the channel or transmission line 42 prior to a branch point. The isolation buffer 110, shown as an inverter, receives variable power supply bias signals $V_L$ and $V_H$ from the delay control circuit 70 to set its delay. Fixed delay buffers $112_1$ and $112_2$, are then included in the branches $42_1$ and $42_2$ after the fan out point. The buffers $112_1$ and $112_2$, also shown as inverters, receive fixed power supply inputs V+ and V− from the system power supply rails. Although two buffers $112_1$ and $112_2$ are shown, the fan out could be to more than two buffers.

Series inverters 114 and 116 in FIG. 11 serve in place of the reference buffer 76 of FIG. 8. Inverter 114 receives the variable power supply bias signals $V_L$ and $V_H$ from the loop filter 80. Inverter 116 receives the fixed power supply rails V+ and V−. All of the inverters are preferably made as similar as possible, including being made on the same semiconductor wafer to create similar device and temperature variation characteristics. As such, the circuit of FIG. 11 provides fan out from a common channel with isolation buffers creating a uniform delay. The circuit of FIG. 11 provides an advantage over the circuit of FIG. 8 using buffers as shown in FIG. 7 since only a single buffer is required in each branch point.

Figure 12:
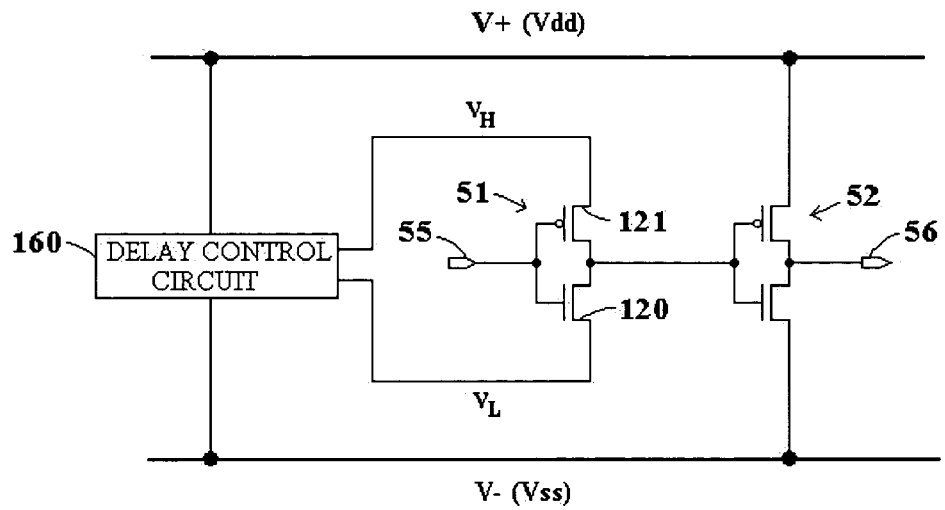
FIG. 12 illustrates an embodiment for the isolation buffer of FIG. 7 formed by series CMOS inverters, the first series CMOS inverter having delay controlled by a single delay control circuit.

FIG. 12 illustrates an embodiment for the isolation buffer of FIG. 7 formed by series CMOS inverters, the inverter 51 having delay controlled by a single delay control circuit 160, while the inverter 52 has a fixed delay. The delay control circuit 160 combines the functions of circuits 60 and 61 of FIG. 7, similar to delay control circuit 70 of FIG. 11. The CMOS inverter 51 includes a PMOS transistor 121 and NMOS transistor 120 that receive the delay control voltages $V_H$ and $V_L$ generated from delay control circuit 160, similar to the circuit 70 of FIG. 11. The CMOS inverter 52 likewise includes a PMOS and an NMOS transistor, with the transistors driven by the fixed V− and V+ voltage rails.

Figure 13:
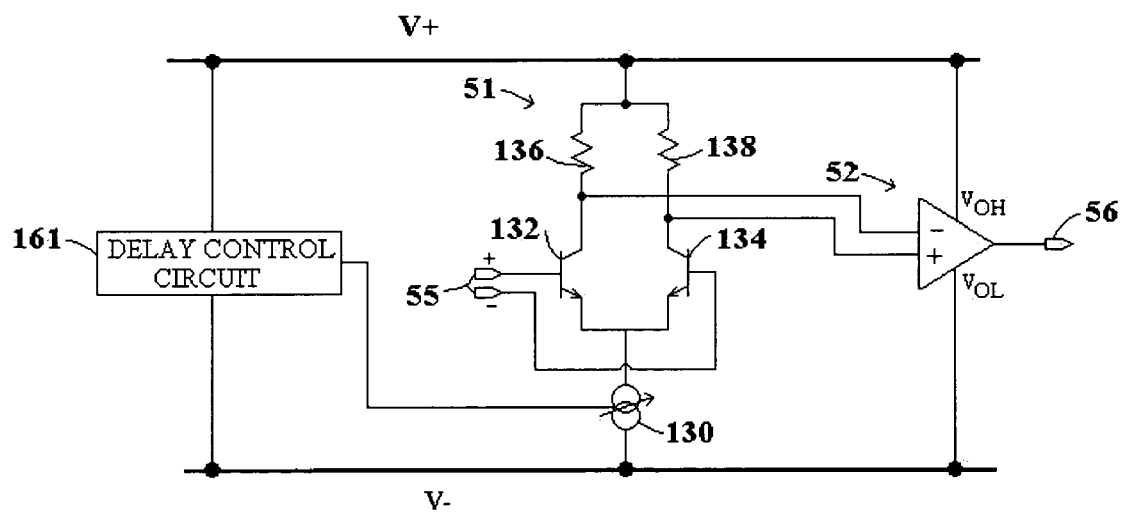
FIG. 13 illustrates an embodiment with an isolation buffer configured as a differential amplifier having delay controlled by varying current through the differential amplifier.

FIG. 13 illustrates an isolation buffer configuration with delay controlled by varying current, as opposed to varying voltage in the circuit of FIG. 12. FIG. 13 further illustrates that buffers can take other configurations, such as differential amplifiers made using bipolar junction transistors (BJTs), as opposed to CMOS inverters. As shown, buffer 51 in FIG. 13 is a differential amplifier with a current sink 130 having current controlled by a delay control circuit 161. In one embodiment, the delay control circuit 161 can be configured as the circuit 70 of FIG. 8. In such a configuration for delay control circuit 161, the output of the loop filter 80 of FIG. 8 would supply current inputs of the reference buffer 76 configured as a differential amplifier and the differential amplifier buffer 51. The buffer 51 of FIG. 13 includes BJT transistors 132 and 134 having bases forming + and − differential amplifier inputs, common emitters connected to the current sink 130, and collectors provided through resistors 136 and 138 to the V+ power supply rail.

The differential amplifier 51 can be used alone, or if a rail-to-rail single output is desired, can be connected through a second amplifier 52 to the output 56. The differential amplifier 51 will not deliver rail-to-rail V+ and V− voltages, since the resistors 136 and 138 as well as current sink 130 limit the output swing. If a rail-to-rail output is desired, the amplifier 52 configured as a comparator, as shown in FIG. 13 with control voltages $V_{OH}$ and $V_{OL}$ connected to the V+ and V− rails, will provide the desired rail-to-rail swing.

Although the present invention has been described above with particularity, this was merely to teach one of ordinary skill in the art how to make and use the invention. Many additional modifications will fall within the scope of the invention, as that scope is defined by the following claims.

What is claimed is:

1. An apparatus comprising:
a variable delay isolation buffer having a signal input, a signal output, and a variable delay control input for selectively varying a delay caused by the variable delay isolation buffer in a signal traveling from the signal input to the signal output; and
a delay control circuit having an output providing the variable delay control input of the variable delay isolation buffer, the delay control circuit setting a delay control voltage potential at its output to control delay through the variable delay isolation buffer to substantially match delay through a time delay reference.

2. The apparatus of claim 1, further comprising:
driver buffers each having a signal input connected to the output of the variable delay isolation buffer, and a power supply input connected to receive a system voltage.

3. The apparatus of claim 2, wherein each of the driver buffers and the variable delay isolation buffer comprises a CMOS inverter.

4. The apparatus of claim 2,
wherein the signal input of the variable delay isolation buffer forms a first terminal of a channel on a probe card with the second terminal of the channel configured for connection to a tester for transmitting and receiving test signals for testing devices on a wafer, and
wherein the output of each of the driver buffers is configured to connect to a respective probe for contacting devices on the wafer.

5. The apparatus of claim 1, wherein the variable delay isolation buffer comprises a differential amplifier with a variable current sink providing the variable delay control input.

6. An apparatus of claim 1, wherein the variable delay isolation buffer comprises a first variable delay isolation buffer, the apparatus further comprising:
additional variable delay isolation buffers each having a signal input connected in common with the first variable delay isolation buffer, a variable delay control input connected to the output of the delay control circuit, and having an output.

7. The apparatus of claim 6 further comprising:
driver buffers each having a signal input connected to the output of one of the first and additional variable delay isolation buffers and having a power supply input connected to receive a system voltage.

8. The apparatus of claim 1, wherein the variable delay isolation buffer and the delay control circuit are provided on a probe card, wherein the output of each variable delay isolation buffer is connected to a separate probe on the probe card.

9. An apparatus comprising:
a variable delay isolation buffer having a signal input, a variable delay control input, and an output; and
a delay control circuit having an output providing the variable delay control input of the variable delay isolation buffer, the delay control circuit setting a delay control voltage potential at its output to control delay through the variable delay isolation buffer to substantially match delay through a time delay reference, wherein the delay control circuit comprises:
a reference delay line;
a reference buffer having a signal input, a variable delay control input, and an output; and
a phase comparator having a first input connected to reference delay line, a second input connected to the output of the reference buffer, and having an output connected to the variable delay control inputs of the reference buffer and the variable delay isolation buffer.

10. The apparatus of claim 9, wherein the variable delay isolation buffer and the reference buffer are fabricated on a single wafer.

11. The apparatus of claim 9 further comprising:
an oscillator connected by the reference delay line to the first input of the phase comparator and by the reference buffer to the second input of the phase comparator; and
a loop filter connecting the output of the phase comparator to the variable delay control inputs of the reference buffer and the variable delay isolation buffer.

12. The apparatus of claim 11,
wherein the variable delay control inputs of the reference buffer and isolation buffer each comprise a high level voltage input line and a low level voltage input line,
wherein a system voltage comprises a system high voltage and a system low voltage power supply, and
wherein the loop filter connects the phase comparator output to the high and low level voltage input lines of the reference buffer and the variable delay isolation buffer, the loop filter comprising a means for integrating and centerlining the phase comparator output to provide an integrated signal on the high level voltage line relative to the high voltage power supply and an integrated signal on the low level voltage line relative to the low voltage power supply, so that the integrated signals on the high and low level voltage lines are centered between the high and low level voltage power supplies.

13. The apparatus of claim 12, wherein the means for integrating and centerlining comprises:
first resistor having a first terminal connected to the output of the phase comparator, and a second terminal;
a second resistor having a first terminal connected to a system high voltage power supply line to receive the system high voltage power supply, and having a second terminal;
a first capacitor;
a first amplifier having a noninverting (+) input connected to the second terminal of the first and second resistors, an inverting (−) input, and having an output connected to the high voltage input lines of the reference buffer and the variable delay isolation buffer, wherein the output of the first amplifier is fed back to its inverting (−) input through the first capacitor;

a third resistor having a first terminal connected to the output of the phase comparator, and a second terminal;

a fourth resistor having a first terminal connected to a system low voltage power supply line to receive a system low voltage potential, and having a second terminal;

a second capacitor; and a second amplifier having an inverting (−) input connected to the second terminal of the third resistor, a non-inverting (+) input connected to the second terminal of the fourth resistor, and having an output connected to the low voltage input lines of the reference buffer and the variable delay isolation buffer, wherein the output of the second amplifier is fed back to its inverting (−) input through the second capacitor.

14. The apparatus of claim 9, wherein the variable delay isolation buffer comprises:

a first inverter having a variable delay control input receiving the control voltage potential as varied from a system voltage; and a second inverter connected in series with the first inverter, the second inverter having a power supply input connected to the receive the system voltage, and wherein the reference buffer comprises:

a first inverter having a variable delay control input receiving the control voltage potential as varied from a system voltage; and a second inverter connected in series with the first inverter, the second inverter having a power supply input connected to the receive the system voltage.

* * * * *